United States Patent
Hosaka (10) Patent No.: US 10,420,266 B2
(45) Date of Patent: Sep. 17, 2019

(54) NOZZLE MANAGEMENT DEVICE AND CONTROL METHOD OF NOZZLE MANAGEMENT DEVICE

(71) Applicant: FUJI CORPORATION, Chiryu-shi (JP)

(72) Inventor: Hideki Hosaka, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/764,385

(22) PCT Filed: Oct. 21, 2015

(86) PCT No.: PCT/JP2015/079684
§ 371 (c)(1),
(2) Date: Mar. 29, 2018

(87) PCT Pub. No.: WO2017/068661
PCT Pub. Date: Apr. 27, 2017

(65) Prior Publication Data
US 2018/0310444 A1   Oct. 25, 2018

(51) Int. Cl.
*H05K 13/04* (2006.01)
*B05B 15/55* (2018.01)
*G05B 15/02* (2006.01)

(52) U.S. Cl.
CPC ......... *H05K 13/0408* (2013.01); *B05B 15/55* (2018.02); *G05B 15/02* (2013.01); *H05K 13/0409* (2018.08)

(58) Field of Classification Search
CPC .......... H05K 13/0408; H05K 13/0409; H05K 13/04; B05B 15/55; G05B 15/02
See application file for complete search history.

(56) References Cited

U.S. PATENT DOCUMENTS

2006/0111222 A1   5/2006   Yasui
2016/0120081 A1   4/2016   Hosaka et al.
(Continued)

FOREIGN PATENT DOCUMENTS

CN   103517626 A   1/2014
JP   10-242688 A   9/1998
(Continued)

OTHER PUBLICATIONS

Extended European Search Report dated Jun. 20, 2018 in European Patent Application No. 15906667.9, citing documents AA and AO through AQ therein, 8 pages.
(Continued)

*Primary Examiner* — Gerald McClain
(74) *Attorney, Agent, or Firm* — Oblon, McClelland, Maier & Neustadt, L.L.P.

(57) ABSTRACT

An object is to provide a nozzle management device and a control method of a nozzle management device capable of shortening a time required for an exchange operation of suction nozzles. In an exchange operation, a control device of the nozzle management device transfers some of multiple suction nozzles serving as storage targets to an empty first socket, and thereafter, controls an operation of a nozzle transfer device so as to alternately and repeatedly perform a loading operation for transferring the suction nozzle designated corresponding to a socket of the nozzle station which is emptied out by the transferred suction nozzle, from the pallet, and an unloading operation for transferring the suction nozzles serving as the storage targets from the nozzle station to the socket which is emptied out by the loading operation.

6 Claims, 8 Drawing Sheets

(56) References Cited

U.S. PATENT DOCUMENTS

2017/0156243 A1\* 6/2017 Iisaka ................ H05K 13/0408
2017/0213332 A1\* 7/2017 Hosaka .................... G01D 5/30

FOREIGN PATENT DOCUMENTS

| JP | 10242688 A \* | 9/1998 |
| JP | 2005086151 A \* | 3/2005 |
| WO | 2014/068673 A1 | 5/2014 |
| WO | 2014/069016 A1 | 5/2014 |
| WO | WO 2014/196002 A1 \* | 12/2014 |

OTHER PUBLICATIONS

International Search Report dated Jan. 26, 2016 in PCT/JP2015/079684 filed Oct. 21, 2015.

\* cited by examiner

NOZZLE MANAGEMENT DEVICE AND CONTROL METHOD OF NOZZLE MANAGEMENT DEVICE

TECHNICAL FIELD

The present application relates to a nozzle management device and a control method of a nozzle management device.

BACKGROUND ART

In a mounting process of an electronic component by using a component mounting machine, a suction nozzle which suctions and holds the electronic component is used. For example, PTL 1 discloses a nozzle management device which holds and manages multiple suction nozzles by using a pallet. The nozzle management device performs an exchange operation for exchanging the suction nozzles between a nozzle station detached from the component mounting machine and installed inside the nozzle management device and the above-described pallet.

CITATION LIST

Patent Literature

PTL 1: WO 2014/068673

SUMMARY

Technical Problem

For example, the exchange operation using the nozzle management device is performed as setup changing of the component mounting machine. Therefore, it is desirable that the nozzle management device shortens a time required for the exchange operation. The present disclosure is made in view of the above-described circumstances, and an object thereof is to provide a nozzle management device and a control method of a nozzle management device capable of shortening a time required for an exchange operation of suction nozzles.

Solution to Problem

According to an aspect of the present disclosure, there is provided a nozzle management device including a pallet that stores suction nozzles used for a component mounting machine, a nozzle station installation device that targets a nozzle station which is detachably installed in the component mounting machine and which holds a plurality of the suction nozzles, and that installs the nozzle station detached from the component mounting machine, a nozzle transfer device that transfers the suction nozzles between the pallet and the nozzle station installed in the nozzle station installation device, and a control device that controls an operation of the nozzle transfer device in accordance with an operation mode. The pallet and the nozzle station respectively have a plurality of sockets capable of holding the suction nozzles by adopting a predetermined posture. The operation mode includes an exchange operation for transferring the plurality of the suction nozzles serving as storage targets from the nozzle station to the pallet, and for transferring the plurality of the suction nozzles which are respectively designated corresponding to the sockets of the nozzle station from the pallet. In the exchange operation, the control device transfers some of the plurality of the suction nozzles serving as the storage targets to a vacant first socket secured in a movable range of the nozzle transfer device, and thereafter, controls the operation of the nozzle transfer device so as to alternately and repeatedly perform a loading operation for transferring the suction nozzle designated corresponding to the socket of the nozzle station which is emptied out by the transferred suction nozzle, from the pallet, and an unloading operation for transferring some of the plurality of the suction nozzles serving as the storage targets from the nozzle station to the socket of the pallet which is emptied out by the loading operation.

According to an aspect of the present disclosure, there is provided a control method of a nozzle management device which includes a pallet that stores suction nozzles used for a component mounting machine, a nozzle station installation device that targets a nozzle station which is detachably installed in the component mounting machine and which holds a plurality of the suction nozzles, and that installs the nozzle station detached from the component mounting machine, a nozzle transfer device that transfers the suction nozzles between the pallet and the nozzle station installed in the nozzle station installation device, and a control device that controls an operation of the nozzle transfer device in accordance with an operation mode. The pallet and the nozzle station respectively have a plurality of sockets capable of holding the suction nozzles by adopting a predetermined posture. The operation mode includes an exchange operation for transferring the plurality of the suction nozzles serving as storage targets from the nozzle station to the pallet, and for transferring the plurality of the suction nozzles which are respectively designated corresponding to the sockets of the nozzle station from the pallet. The control method includes a retraction step of transferring some of the plurality of the suction nozzles serving as the storage targets to a vacant first socket secured in a movable range of the nozzle transfer device, in the exchange operation, and an exchange step of controlling the operation of the nozzle transfer device so as to alternately and repeatedly perform a loading operation for transferring the suction nozzle designated corresponding to the socket of the nozzle station which is emptied out by the transferred suction nozzle, from the pallet, and an unloading operation for transferring some of the plurality of the suction nozzles serving as the storage targets from the nozzle station to the socket of the pallet which is emptied out by the loading operation.

Advantageous Effects

According to a configuration of the disclosure, the nozzle transfer device reciprocates between the nozzle station and the pallet so as to alternately perform the loading operation and the unloading operation. In this manner, the suction nozzles are transferred in both reciprocating operations by the nozzle transfer device. Accordingly, compared to a configuration in which the designated suction nozzles are loaded together after all of the suction nozzles serving as the storage targets are unloaded in the exchange operation, it is possible to improve operation efficiency of the nozzle transfer device in the exchange operation. In addition, it is possible to shorten a time required for the exchange operation.

DESCRIPTION OF EMBODIMENTS

Hereinafter, an embodiment relating to a nozzle management device and a control method of a nozzle management device according to the present disclosure will be described with reference to the drawings. The nozzle management device is an external device which holds and manages a suction nozzle used for a component mounting machine by using a pallet. In the embodiment, the nozzle management device is a nozzle washing device used in washing the suction nozzle and in inspecting or storing the suction nozzle.

Embodiment (1. Component Mounting Machine 10)

A component mounting machine 10 is a device which causes suction nozzle 90 to hold an electronic component supplied by a feeder and to mount the electronic component at a predetermined position on a circuit board. The suction nozzle 90 is detachably disposed in a transfer device in the component mounting machine 10, and is appropriately exchanged depending on a type of the electronic component serving as a mounting target. The suction nozzle 90 is held in a nozzle station 11 corresponding to different sizes and shapes (refer to FIG. 1).

(1-1. Suction Nozzle 90)

Figure 2:
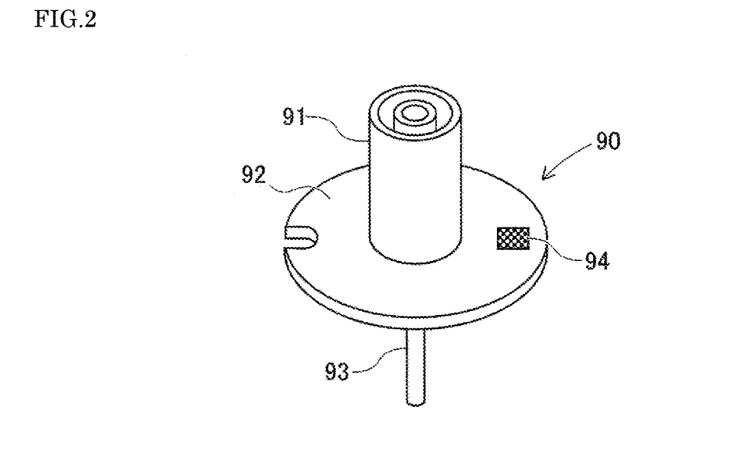
FIG. 2 is a perspective view illustrating a suction nozzle used for a component mounting machine.

As illustrated in FIG. 2, the suction nozzle 90 has a trunk shaft 91, a flange 92, a nozzle shaft 93, and a 2D code 94. The trunk shaft 91 is formed in a tubular shape. The trunk shaft 91 functions as a main body section held in a transfer device of the component mounting machine 10. The flange 92 is formed in a disc shape, and is disposed on one end side in an axial direction of the trunk shaft 91 (lower side in FIG. 2).

The nozzle shaft 93 is formed in a tubular shape extending in the axial direction from the trunk shaft 91. The nozzle shaft 93 comes into contact with and holds the electronic component. The nozzle shaft 93 is configured to be capable of moving forward to and rearward from the trunk shaft 91 in the axial direction. The nozzle shaft 93 is biased in a direction away from the trunk shaft 91 by an elastic member (not illustrated). In a case where a load is applied to a tip portion on the trunk shaft 91 side, the nozzle shaft 93 retreats into the trunk shaft 91 against an elastic force generated by the above-described elastic member. The 2D code 94 is attached to an upper face of the flange 92. The 2D code 94 includes unique information such as an identification code (ID) and a type of the suction nozzle 90.

(1-2. Nozzle Station 11)

The nozzle station 11 is detachably installed in a base of the component mounting machine 10. The nozzle station 11 is formed in a rectangular parallelepiped shape as a whole shape. The nozzle station 11 is configured to be capable of holding the suction nozzle 90 which adopts a posture where the nozzle shaft 93 faces downward.

(2. Nozzle Washing Device 20)

Figure 1:
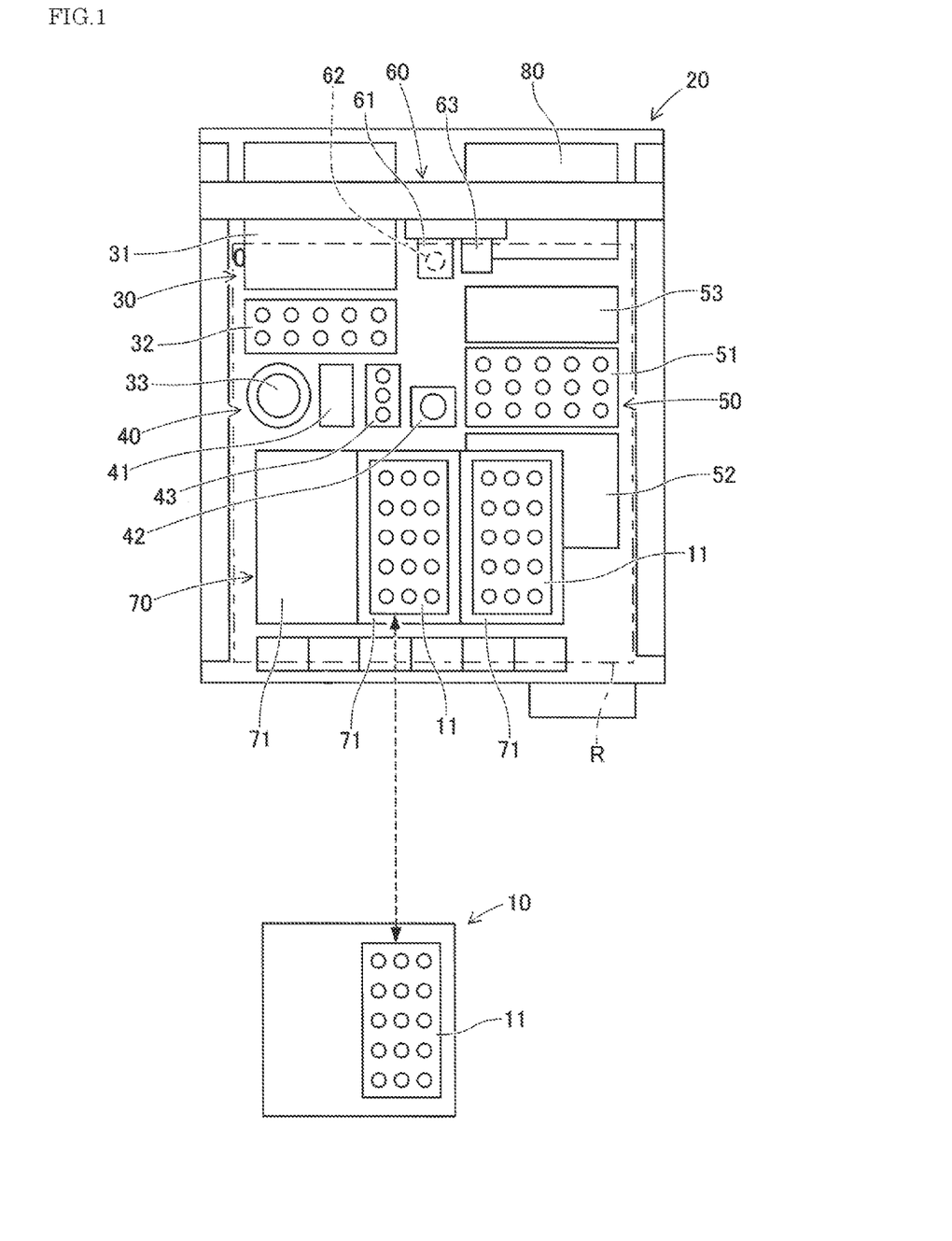
FIG. 1 is a top view illustrating a configuration of a nozzle washing device according to an embodiment.

The nozzle washing device 20 is an external device for the component mounting machine 10 as illustrated in FIG. 1. In the present embodiment, the nozzle washing device 20 is a nozzle management device which loads the nozzle station 11 in a state of holding multiple suction nozzles 90 and which washes, inspects, and stores the suction nozzle 90 as a target.

In addition, the nozzle washing device 20 has a function to support setup changing of the component mounting machine 10 by transferring the stored suction nozzle 90 to the nozzle station 11 in response to a request. The nozzle washing device 20 includes a washing unit 30, an inspection unit 40, a nozzle stocker 50, a nozzle transfer device 60, a nozzle station installation device 70, a control device 80, and a discharge box 85.

(2-1. Washing Unit 30)

The washing unit 30 has a function relating to washing in maintenance for the suction nozzle 90 serving as a target in the nozzle washing device 20. The washing unit 30 configures a part of a maintenance device which performs maintenance on the suction nozzle 90 serving as a management target. The washing unit 30 has a washing chamber 31, a washing pallet 32 (corresponding to a "maintenance pallet" according to the present disclosure), and a blow device 33.

The washing chamber 31 washes and dries the suction nozzle 90 inside the container. The washing pallet 32 holds the suction nozzle 90 in a movable range R of the nozzle transfer device 60. The washing pallet 32 is moved between the inside of the washing chamber and a defined position (inside the movable range R and a position where the washing pallet 32 is illustrated in FIG. 1) by a pallet moving mechanism (not illustrated). The blow device 33 blows air to the washed suction nozzle 90 so as to dry the suction nozzle 90.

The washing unit 30 having the above-described configuration performs a washing process and a drying process on the suction nozzle 90 serving as a target transferred to the washing unit 30 by the nozzle transfer device 60. Specifically, the washing unit 30 moves the washing pallet 32 into the washing chamber 31 in a state where the suction nozzle 90 is held by the washing pallet 32. The washing unit 30 circulates high pressure water inside the suction nozzle 90 in the washing chamber 31, and washes the suction nozzle 90 by ejecting the high pressure water onto an outer surface of the suction nozzle 90.

Then, the washing unit 30 dries the suction nozzle 90 in the washing chamber 31, and moves the washing pallet 32 to a defined position. Thereafter, the suction nozzle 90 is individually moved into the blow device 33 by the nozzle transfer device 60, and moisture is blown away and dried by an operation of the blow device 33. In addition, the suction nozzle 90 for which the drying process is completed is appropriately transferred to a storage pallet 51 of the nozzle stocker 50 or the nozzle station 11 by the nozzle transfer device 60.

(2-2. Inspection Unit 40)

The inspection unit 40 has a function relating to inspecting a state of the suction nozzle 90 in the maintenance of the suction nozzle 90 serving as an inspection target in the nozzle washing device 20. The inspection unit 40 configures a part of the maintenance device which performs maintenance on the suction nozzle 90 serving as the management target. In the present embodiment, the above-described state of the suction nozzle 90 includes a sliding state and a tip portion state.

The inspection unit 40 has a load cell 41, an inspection camera 42, and a jig placement table 43. The load cell 41 is used for the inspection of the sliding state of the suction nozzle 90. The load cell 41 detects a load when the nozzle shaft 93 of the suction nozzle 90 slides inward of the trunk shaft 91. The suction nozzle 90 whose value detected by the load cell 41 is greater than a defined value has increased sliding resistance due to some factors, and is determined to be defective.

The inspection camera 42 is fixed to a base of the nozzle washing device 20 so that an optical axis thereof is oriented upward in a vertical direction, and is configured to be capable of imaging the suction nozzle 90 from below the nozzle transfer device 60. Specifically, the inspection camera 42 is configured to be capable of imaging the suction nozzle 90 in a state of being held in the nozzle transfer device 60. The inspection camera 42 is used for the inspection of the tip portion state of the suction nozzle 90. Through this inspection, it is confirmed whether or not a shape of the nozzle shaft 93 is proper and whether or not any chip or adhered matter is present. The suction nozzle 90 in which the shape of the tip portion is determined to be abnormal has the chip in the tip portion, for example, and is determined to be defective.

The jig placement table 43 (corresponding to a "temporary placement table" according to the present disclosure) is configured to be capable of holding a jig nozzle used for a calibration processing in the nozzle washing device 20. For example, the calibration processing is a process of acquiring a calibration value for calibrating an operation of the nozzle transfer device 60. For example, the calibration processing is performed by positioning the jig nozzle in a state of being held in the nozzle transfer device 60, and based on a difference between a control target position and an actual position recognized by the inspection camera 42, the above-described calibration value is calculated. The jig placement table 43 is configured to be capable of holding the suction nozzle 90 used for a mounting process of the component mounting machine 10.

(2-3. Nozzle Stocker 50)

Figure 3:
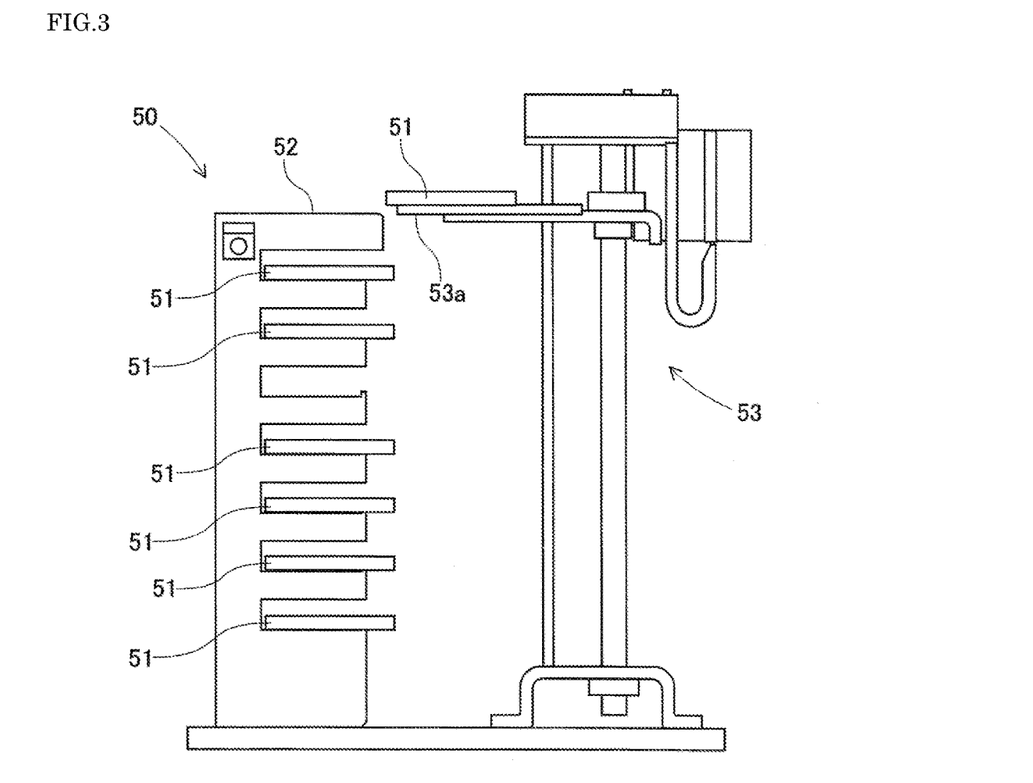
FIG. 3 is a side view illustrating a nozzle stocker.

The nozzle stocker 50 stores the suction nozzle 90 transferred to the storage pallet 51 by the nozzle transfer device 60 so that the suction nozzle 90 can be loaded and unloaded. As illustrated in FIG. 3, the nozzle stocker 50 includes multiple storage pallets 51, an accommodation device 52, and a carrier 53. The storage pallet 51 (corresponding to a "pallet" according to the present disclosure) holds the multiple suction nozzles 90 used for the component mounting machine 10.

In the present embodiment, the accommodation device 52 accommodates the multiple storage pallets 51 in a state of being arrayed parallel to each other at predetermined intervals in an up-down direction. In the accommodation device 52, the carrier 53 moves and exchanges the storage pallet 51 corresponding to a request between a position where the multiple storage pallets 51 are accommodated and a position where the nozzle transfer device 60 can unload the suction nozzle 90 (uppermost stage position in the present embodiment).

The carrier 53 functions as a moving mechanism which can move a support arm 53a for supporting the storage pallet 51 in an accommodation direction (left-right direction in FIG. 3) and the up-down direction of the accommodation device 52. The carrier 53 moves the support arm 53a upward after the support arm 53a is inserted into a lower portion of the storage pallet 51 accommodated in the accommodation device 52. Then, the carrier 53 horizontally moves the support arm 53a to a side opposite to the accommodation device 52, and unloads the supported storage pallet 51 from the accommodation device 52.

(2-4. Nozzle Transfer Device 60)

In the movable range R (refer to FIG. 1), the nozzle transfer device 60 transfers the suction nozzle 90 among the washing unit 30, the inspection unit 40, the nozzle stocker 50, the nozzle station installation device 70, and the discharge box 85. The nozzle transfer device 60 includes a transfer head 61, a holding chuck 62, and a head camera 63. The transfer head 61 is disposed in a moving mechanism which is movable in a three-dimensional direction.

The holding chuck 62 is detachably disposed in the transfer head 61, and grips and holds the suction nozzle 90 one by one. The holding chuck 62 is configured to be rotatable around an axis line of the holding chuck 62 by driving the transfer head 61. The head camera 63 is fixed to the transfer head 61 so that the optical axis is oriented downward in the vertical direction. The head camera 63 is configured to image various 2D codes attached to the nozzle station 11, the storage pallet 51, and the suction nozzle 90.

(2-5. Nozzle Station Installation Device 70)

The nozzle station installation device 70 targets various nozzle stations 11, and is used for installing the nozzle station 11 detached from the component mounting machine 10 inside the nozzle washing device 20. The nozzle station installation device 70 includes three reference bases 71 and an intermediate base 72. The three reference bases 71 have the same configuration, and are arranged at a predetermined interval.

In the three reference bases 71, various nozzle stations 11 are directly installed, or are indirectly installed via the intermediate base 72. In addition, each of the three reference bases 71 is provided with multiple seating sensors. The control device 80 is configured as follows. The control device 80 inputs a detection signal transmitted from each of seating sensors, and based on the detection signal, the control device 80 can recognize a state where the intermediate base 72 is placed and a state where the nozzle station 11 is directly placed.

(2-6. Control Device 80)

The control device 80 is a controller configured to mainly include a CPU, various memories, and a control circuit. The control device 80 may be configured to be connected to a host computer serving as an external device so as to enable communication and sharing various types of information therebetween. The control device 80 controls an operation of each device such as the nozzle transfer device 60, in accordance with an operation mode of the nozzle washing device 20.

The above-described operation mode includes an exchange operation for transferring the suction nozzle 90 serving as a storage target from the nozzle station 11 installed in the nozzle station installation device 70 to the storage pallet 51, and for transferring the multiple designated suction nozzles 90 from the storage pallet 51 to the nozzle station 11. In addition, the operation mode includes a maintenance operation for performing a series of washing, inspecting, and accommodating the suction nozzle 90. Details of the control of the exchange operation controlled by the control device 80 will be described later.

(2-7. Discharge Box 85)

The discharge box 85 is detachably installed in the nozzle washing device 20. The discharge box 85 accommodates the suction nozzle 90 determined to be defective based on an inspection result obtained by the inspection unit 40. The discharge box 85 is partitioned into multiple spaces, and is used for defect classification for each defect factor, for example.

(3. Exchange Operation Performed by Control Device 80)

Figure 5A:
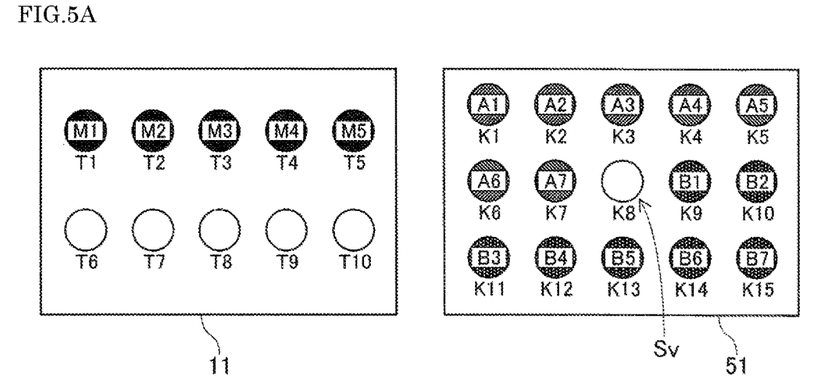
FIG. 5A is a view illustrating each state of a nozzle station and a pallet after a preparation process is performed.

The above-described control of the exchange operation of the suction nozzle 90 which is performed by the control device 80 in the nozzle washing device 20 will be described. As described above, the nozzle station 11 and the storage pallet 51 respectively have multiple sockets capable of holding the suction nozzle 90 by adopting a predetermined posture in the movable range R of the nozzle transfer device 60. In order to facilitate description, as illustrated in FIG. 5A, it is assumed that the nozzle station 11 has 10 sockets T1 to T10 and the storage pallet 51 has 15 sockets K1 to K115.

In FIGS. 5A to 5F, each of the sockets T1 to T10 and K1 to K15 is illustrated using a black background in a case where the suction nozzle 90 is held, and is illustrated using a white background in a case where the suction nozzle 90 is not held. For example, whether or not each of the sockets T1 to T10 and K1 to 15 holds the suction nozzle 90 is recognized, based on image data obtained by causing the head camera 63 of the nozzle transfer device 60 to image the sockets.

(3-1. Preparation Process)

Figure 4:
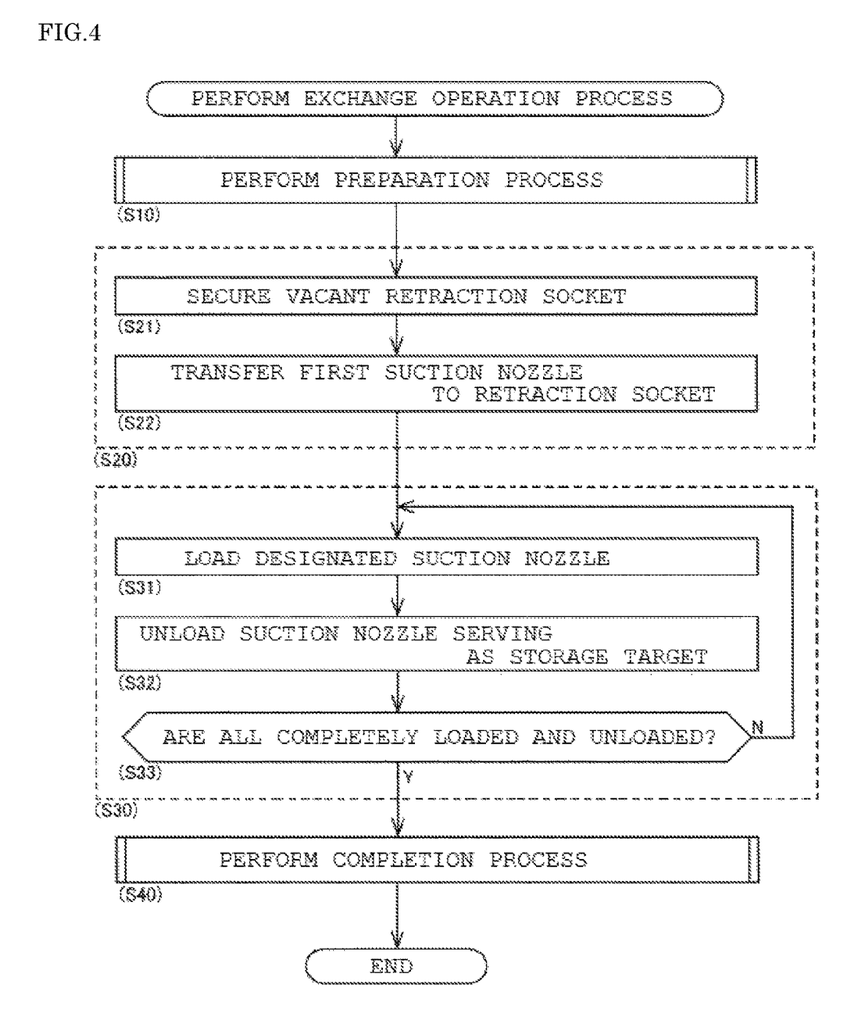
FIG. 4 is a flowchart illustrating an exchange operation process of the suction nozzle.
Figure 6:
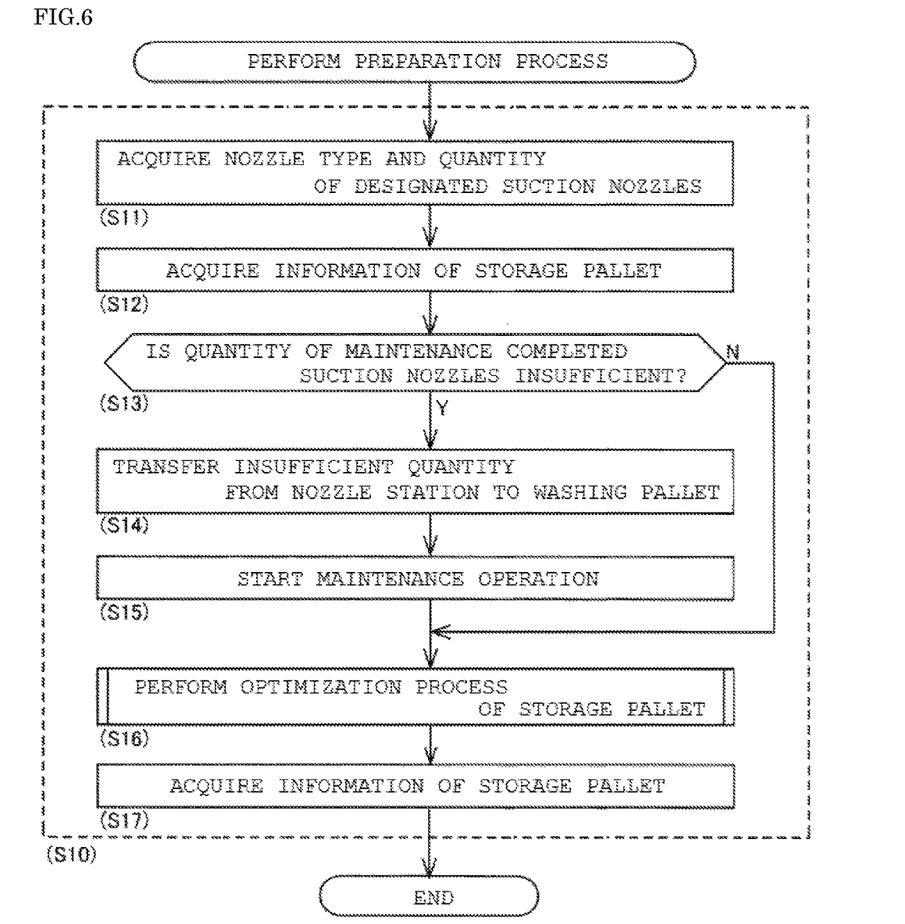
FIG. 6 is a flowchart illustrating the preparation process in FIG. 4.

First, as illustrated in FIG. 4, the control device 80 of the nozzle washing device 20 performs a preparation process in accordance with the exchange operation (Step 10 (hereinafter, "Step" is expressed as "S"). In the preparation process, as illustrated in FIG. 6, the control device 80 acquires a type and a quantity of the suction nozzles 90 designated to be loaded into the nozzle station 11 in the exchange operation (S11).

In each of the sockets T1 to T10 of the nozzle station 11, a nozzle type is designated, for example. In the present embodiment, the suction nozzle 90 whose nozzle type is an A-type is designated to the sockets T1 and T2, the suction nozzle 90 whose nozzle type is a B-type is designated to the sockets T3 to T5, and "empty" is designated to the remaining sockets T6 to T10.

Accordingly, the quantity of the suction nozzles 90 required for the exchange operation is 2 for the A-type suction nozzle 90, and is 3 for the B-type suction nozzle 90. The "A-type" and the "B-type" of the above-described nozzle types indicate that the nozzle types are different from each other. For example, depending on a dimension or an external shape of the electronic component serving as a suction target, the nozzle types are properly used.

Next, the control device 80 acquires information of the multiple storage pallets 51 accommodated in the nozzle stocker 50 (S12). Specifically, the control device 80 acquires the nozzle type and the quantity of the suction nozzles 90 stored in each of the multiple storage pallets 51. Then, the control device 80 causes the maintenance device (in the present embodiment, the washing unit 30 and the inspection unit 40) to perform the maintenance on the quantity (in the present embodiment, two A-types and three B-types) of the multiple the suction nozzles 90 designated in the exchange operation, and thereafter, determines whether or not the quantity of the suction nozzles 90 stored in the nozzle stocker 50 is sufficient (S13).

In a case where the quantity of the suction nozzles 90 required for the exchange operation is insufficient in the nozzle stocker 50 (S13: Yes), the control device 80 controls the operation of the nozzle transfer device 60 so as to transfer at least the insufficient quantity of the suction nozzles 90 from the nozzle station 11 to the washing pallet 32 (S14). For example, in a case where the stored number of the maintenance completed B-type suction nozzles 90 in the nozzle stocker 50 is one compared to a case where the required number of the B-type suction nozzles 90 is three, the control device 80 transfers two B-type suction nozzles 90 corresponding to the insufficient quantity from the nozzle station 11 to the washing pallet 32.

Thereafter, the control device 80 starts the maintenance operation (in the present embodiment, a washing process) (S15). In this manner, the subsequent processes are performed concurrently with the maintenance operation. In addition, the control device 80 may add a defined quantity to the insufficient quantity in a case where the suction nozzles 90 corresponding to the insufficient quantity are transferred to the washing pallet 32 (S14). In this manner, for example, it is possible to prevent a possibility that some of the suction nozzles 90 may be determined to be defective in the inspection after the washing and the quantity of the suction nozzles 90 may be insufficient again.

Subsequently, in a case where the quantity of the suction nozzles 90 required for the exchange operation is not insufficient in the nozzle stocker 50 (S13: No), and in a case where the maintenance operation starts (S15), the control device 80 performs an optimization process of the storage pallet 51 (S16). This optimization process of the storage pallet 51 is a process of improving efficiency in the required operation of the nozzle stocker 50 in order to load the suction nozzle 90 designated in the exchange operation into the nozzle station 11.

In detail, the control device 80 determines whether or not the multiple storage pallets 51 accommodated in the nozzle stocker 50 are required in order to transfer the suction nozzle 90 designated in the exchange operation to the nozzle station 11. In a case where it is determined that the multiple storage pallets 51 are required, the control device 80 sets a combination of the multiple storage pallets 51 required for the exchange operation so as to minimize at least one of a movement number, a movement time, and a movement distance of the storage pallets 51, which are involved in a movement operation of the carrier 53.

Specifically, the control device 80 preferentially sets the storage pallet 51 which holds more suction nozzles 90 having the designated nozzle type out of the multiple storage pallets 51. In the manner, the movement number of the storage pallets 51 which are involved in the movement operation of the carrier 53 is minimized. In addition, the control device 80 may preferentially set the storage pallet 51 close to an uppermost stage, based on a position in the up-down direction of the storage pallet 51 accommodated in the accommodation device 52 of the nozzle stocker 50.

Based on a result of the optimization process of the storage pallet 51, the control device 80 controls the movement operation of the carrier 53 of the nozzle stocker 50 so as to move the first set storage pallet 51 to the uppermost stage position (S17). In addition, in the optimization process (S16) of the storage pallet 51, in a case where the quantity of the storage pallets 51 required for the exchange operation is one, the control device 80 performs control so as to move the storage pallet 51 to the uppermost stage position of the nozzle stocker 50 (S17). Hereinafter, in order to facilitate description, description will be made on the assumption that the quantity of the storage pallets 51 required for the exchange operation is one.

(3-2. Retraction Step)

Subsequently, the control device 80 performs a retraction step of transferring some of the multiple suction nozzles 90 serving as the storage targets to a vacant retraction socket Sv (corresponding to a "first socket" according to the present disclosure) secured in the movable range of the nozzle transfer device 60 (S20). In detail, the control device 80 first recognizes a position of the retraction socket Sv, and secures the vacant retraction socket Sv (S21).

The present embodiment adopts a configuration as follows. In the operation mode excluding the exchange operation, the control device 80 maintains a vacant state for some of the sockets K1 to K15 in the storage pallet 51, and secures the vacant retraction socket Sv in the storage pallet 51. As illustrated in FIG. 5A, the retraction socket Sv is secured in one location of the sockets K1 to K10 so that one of the suction nozzles 90 can be held.

This is based on a fact that one holding chuck 62 is disposed in the nozzle transfer device 60 so that the nozzle transfer device 60 transfers the suction nozzle 90 one by one. Therefore, in a case where the nozzle transfer device 60 has the multiple holding chucks 62 and the multiple suction nozzles 90 can be transferred by performing the movement operation once, it is desirable to adopt a configuration where the multiple retraction sockets Sv are secured.

Here, the suction nozzles 90 serving as the storage target held in the nozzle station 11 detached from the component mounting machine 10 and designated to be stored in the nozzle washing device 20 will be hereinafter referred to as suction nozzles M1 to M5. In addition, the suction nozzles 90 which are stored in the nozzle washing device 20, which complete maintenance such as cleaning and inspection, and whose nozzle type is the A-type will be referred to as suction nozzle A1 to A7, and the suction nozzles 90 whose nozzle type is the B-type will be referred to as suction nozzles B1 to B7.

Figure 5B:
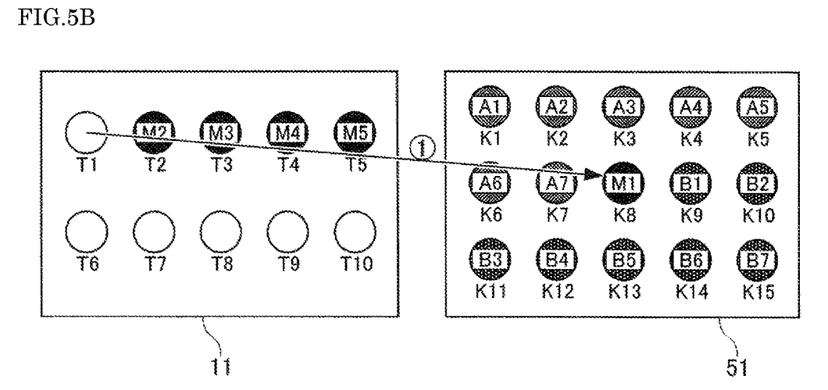
FIG. 5B is a view illustrating a retraction operation of the suction nozzle in a retraction step.

As illustrated in FIG. 5B, the control device 80 transfers the first suction nozzle M1 out of the suction nozzles M1 to M5 serving as the storage targets to the vacant retraction socket Sv (S22). In this manner, the first suction nozzle M1 is held in the socket K8 of the storage pallet 51. In addition, the socket T1 holding the first suction nozzle M1 in the nozzle station 11 is emptied out. Arrows in FIGS. 5B to 5F indicate the movement of the holding chuck 62 holding the suction nozzle 90.

(3-3. Exchange Step)

Figure 5C:
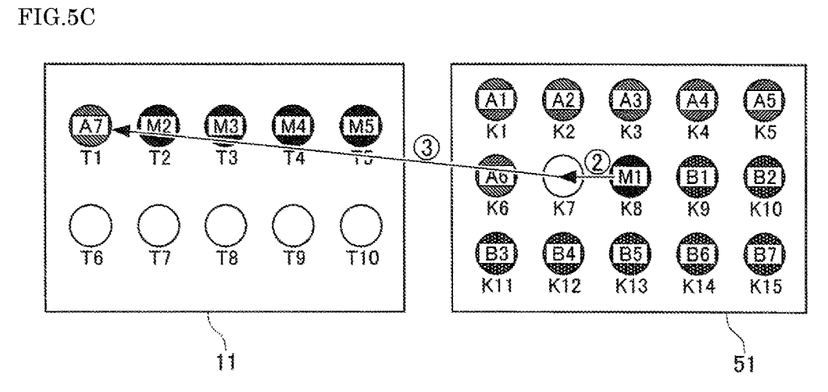
FIG. 5C is a view illustrating a first loading operation in an exchange step.

Subsequently, the control device 80 proceeds to the exchange step (S30). In detail, the control device 80 first performs a loading operation for transferring the designated suction nozzle 90 in the socket T1 of the nozzle station 11 which is emptied out (S31). Specifically, as illustrated in FIG. 5C, the control device 80 causes the holding chuck 62 to hold the suction nozzle A7 held in the socket K7 closest to the socket K8 to which the first suction nozzle M1 is previously transferred in the retraction step (S20), out of the suction nozzles A1 to A7 having the designated nozzle type (A-type) corresponding to the socket T1 of the nozzle station 11.

Then, the holding chuck 62 is moved, and the A-type suction nozzle A7 is transferred to the socket T1 in the nozzle station 11. In this manner, the A-type suction nozzle A7 is held in the socket T1 of the nozzle station 11. In addition, in the storage pallet 51, the socket K7 holding the A-type suction nozzle A7 is emptied out.

Figure 5D:
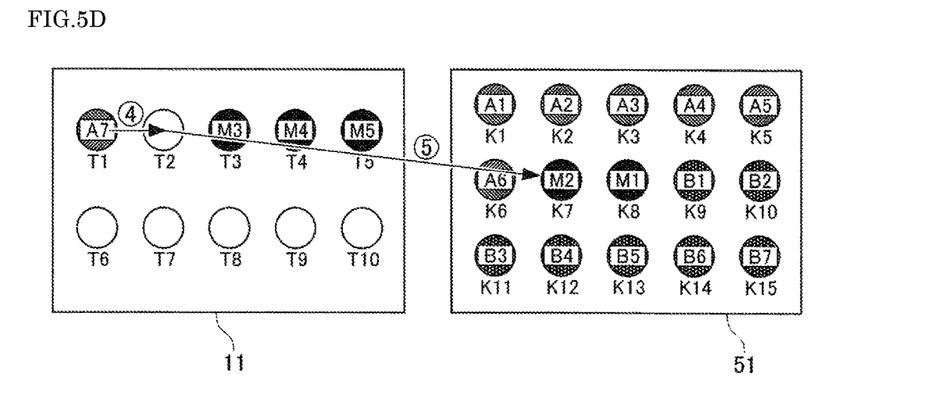
FIG. 5D is a view illustrating a first unloading operation in the exchange step.
Figure 5E:
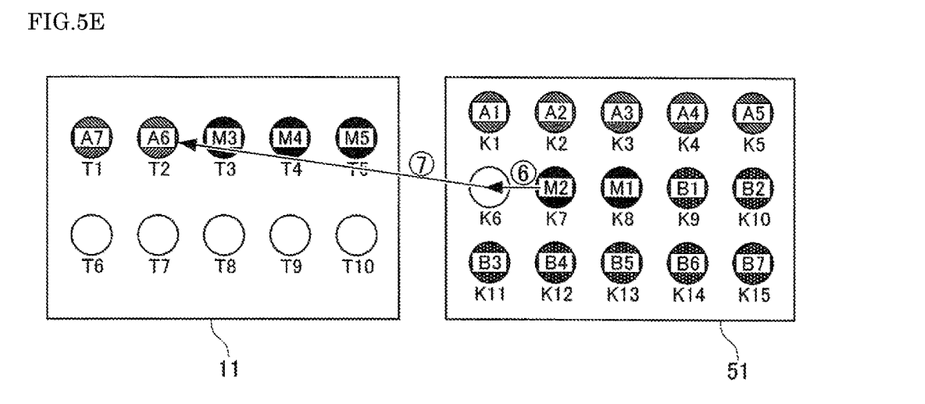
FIG. 5E is a view illustrating a second loading operation in the exchange step.

Next, the control device 80 performs an unloading operation for transferring the suction nozzle 90 serving as the storage target remaining in the storage pallet 51 emptied out by the loading operation (S31) (S32). Specifically, as illustrated in FIG. 5D, the control device 80 causes the holding chuck 62 to hold a second suction nozzle M2 serving as the storage target held in the socket T2 closest to the socket T1 which previously transfers the suction nozzle A7 in the loading operation (S31).

Then, the holding chuck 62 is moved, and the second suction nozzle M2 is transferred to the vacant socket K7 in the storage pallet 51. In this manner, the second suction nozzle M2 serving as the storage target is held in the socket K7 of the storage pallet 51. In addition, the socket T2 holding the second suction nozzle M2 in the nozzle station 11 is emptied out.

Figure 5F:
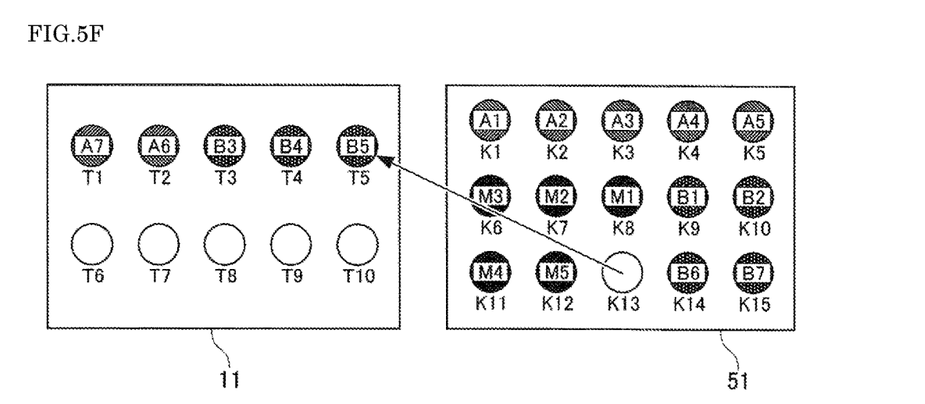
FIG. 5F is a view illustrating a state after the exchange step is completed.

Subsequently, the control device 80 determines whether or not all of the loading operation and the unloading operation are completed (S33). In a case where all are not completed (S33: No), the control device 80 controls an operation of the nozzle transfer device 60 so as to alternately and repeatedly perform the loading operation (S31) and the unloading operation (S32). If all of the loading operation and the unloading operation are completed (S33: Yes), as illustrated in FIG. 5F, all of the suction nozzles M1 to M5 serving as the storage targets are unloaded to the storage pallet 51. In addition, the suction nozzles A7, A6, B3, B4, and B5 of the designated nozzle type are loaded into the sockets T1 to T5 of the nozzle station 11.

In the above-described exchange step (S30), an example has been described where the quantity of the storage pallet 51 required for the exchange operation is one. In contrast, in a case where the multiple the storage pallets 51 are required and the order of the multiple storage pallets 51 used for the exchange operation is set in the optimization process (S16) of the preparation process (S10), the control device 80 controls the movement operation of the nozzle stocker 50 so as to exchange the storage pallet 51, if necessary prior to the loading operation (S31).

(3-4. Completion Process)

Finally, the control device 80 performs a completion process of the exchange operation (S40). In detail, the control device 80 stores information relating to the suction nozzle 90 held in each of the sockets K1 to K10 of the storage pallet 51. In addition, the control device 80 notifies an operator that the designated suction nozzle 90 is completely transferred to the nozzle station 11, and completes the exchange operation.

In the above-described exchange step (S30), it is assumed that one storage pallet 51 is required for the exchange operation and that the designated suction nozzle 90 is held in the storage pallet 51. In contrast, in a case where the quantity of the suction nozzles 90 required for the nozzle stocker 50 is insufficient (S13: Yes) and the maintenance operation is performed concurrently with the above-described exchange step (S30), in the completion process (S40), the required suction nozzle 90 is transferred to the nozzle station 11 from the washing unit 30 to the inspection unit 40 through the inspection.

(4. Advantageous Effect Obtained by Configuration of Embodiment)

The nozzle management device (nozzle washing device 20) includes the pallet (storage pallet 51) that stores the suction nozzle 90 used for the component mounting machine 10, the nozzle station installation device 70 that targets the nozzle station 11 which is detachably installed in the component mounting machine 10 and which holds the multiple suction nozzles 90, and that installs the nozzle station 11 detached from the component mounting machine 10, the nozzle transfer device 60 that transfers the suction nozzles 90 between the pallet (storage pallet 51) and the nozzle station 11 installed in the nozzle station installation device 70, and the control device 80 that controls the operation of the nozzle transfer device 60 in accordance with the operation mode. The pallet (storage pallet 51) and the nozzle station 11 respectively have the multiple sockets capable of holding the suction nozzle 90 by adopting a predetermined posture. The operation mode includes the exchange operation for transferring the multiple suction nozzles 90 serving as the storage target from the nozzle station 11 to the pallet (storage pallet 51), and for transferring the multiple suction nozzles 90 which are respectively designated corresponding to the sockets of the nozzle station 11 from the pallet (storage pallet 51). In the exchange operation, the control device 80 transfers some of the multiple suction nozzles 90 serving as the storage targets to the vacant first socket (retraction socket Sv) secured in a movable range of the nozzle transfer device 60 (S20), and thereafter, controls the operation of the nozzle transfer device 60 so as to alternately and repeatedly perform the loading operation (S21) for transferring the suction nozzle 90 designated corresponding to the socket of the nozzle station 11 which is emptied out by the transferred suction nozzle 90, from the pallet (storage pallet 51), and the unloading operation (S22) for transferring some of the multiple suction nozzles 90 serving as the storage targets from the nozzle station 11 to the socket of the pallet (storage pallet 51) which is emptied out by the loading operation.

In addition, the control method of the nozzle washing device 20 (nozzle management device) includes the retraction step (S20) of transferring some of the multiple suction nozzles 90 serving as the storage targets to the vacant first socket (retraction socket Sv) secured in the movable range of the nozzle transfer device 60, in the exchange operation, and the exchange step (S30) of controlling the operation of the nozzle transfer device 60 so as to alternately and repeatedly perform the loading operation (S31) for transferring the suction nozzle 90 designated corresponding to the socket of the nozzle station 11 which is emptied out by the transferred suction nozzle 90, from the pallet (storage pallet 51), and the unloading operation (S32) for transferring some of the multiple suction nozzles 90 serving as the storage targets from the nozzle station 11 to the socket of the pallet (storage pallet 51) which is emptied out by the loading operation.

According to this configuration, the nozzle transfer device 60 reciprocates between the nozzle station 11 and the storage pallet 51 so as to alternately perform the loading operation and the unloading operation. In this manner, the suction nozzles 90 are transferred in both reciprocating operations of the holding chuck 62 by the nozzle transfer device 60. Accordingly, compared to a configuration in which the designated suction nozzles are loaded together after all of the suction nozzles serving as the storage targets are unloaded in the exchange operation, it is possible to improve operation efficiency of the nozzle transfer device 60 in the exchange operation. In addition, it is possible to shorten a time required for the exchange operation.

In addition, the exchange operation can be performed using the storage pallets 51 having the smaller quantity of the empty sockets, compared to the quantity of the suction nozzles 90 serving as the storage target. Therefore, when the exchange operation is performed, it is not necessary to prepare the storage pallet 51 having the empty sockets as many as the quantity of the suction nozzles 90 serving as at least the storage targets. Accordingly, the storage pallet 51 used for the exchange operation is less restricted. As a result, the movement number of the storage pallet 51 in the exchange operation can be reduced. Therefore, the time required for the exchange operation can be shortened.

In addition, the control device 80 maintains a vacant state for some of the multiple sockets in the pallet (storage pallet 51) in the operation mode excluding the exchange operation, and secures the vacant first socket (retraction socket Sv) in the pallet (storage pallet 51). According to this configuration, the vacant retraction socket Sv is always secured in the storage pallet 51. Therefore, when the exchange operation is performed, it is not necessary to carry out preparation work for securing the vacant retraction socket Sv. It is possible to instantly proceed to the unloading operation and the loading operation of the suction nozzle 90, if necessary. In this manner, the time required for the exchange operation can be shortened.

In addition, the nozzle management device (nozzle washing device 20) further includes the stocker (nozzle stocker 50) that accommodates the multiple pallets (storage pallets 51). The stocker (nozzle stocker 50) has the carrier 53 which moves the pallet (storage pallet 51) between the position where the multiple pallets (storage pallets 51) are accommodated and the position where the nozzle transfer device 60 can unload the suction nozzle 90. In a case where the control device 80 requires the multiple pallets (storage pallet 51) accommodated in the stocker (nozzle stocker 50) in order to transfer the multiple suction nozzles 90 designated in the exchange operation to the nozzle station 11, the control device 80 sets a combination of the multiple pallets (storage pallets 51) required for the exchange operation so as to minimize at least one of the movement number, the movement time, and the movement distance of the pallet, which are involved in the movement operation of the carrier 53 (storage pallets 51) (S16).

The nozzle washing device 20 uses the multiple storage pallets 51 so as to manage the multiple suction nozzles 90. In addition, in a case where the multiple storage pallets 51 are used for the exchange operation, the carrier 53 needs to perform for exchanging the storage pallet 51, and it takes time in accordance with the movement number of the storage pallet 51. In contrast, according to the above-described configuration, the exchange operation is optimized so that the operation time of the carrier 53 is minimized in the nozzle stocker 50. In this manner, the time required for the exchange operation can be shortened.

In addition, the nozzle management device (nozzle washing device 20) further includes the maintenance device (the washing unit 30 and the inspection unit 40) that performs the maintenance on the suction nozzle 90 serving as the management target. The maintenance device (the washing unit 30 and the inspection unit 40) has the maintenance pallet (washing pallet 32) which holds the suction nozzle 90 in the movable range R of the nozzle transfer device 60. In a case where compared to the quantity of the multiple suction nozzles 90 designated in the exchange operation, the quantity of the suction nozzles 90 stored in the nozzle management device (nozzle washing device 20) after the maintenance is performed by the maintenance device (the washing unit 30 and the inspection unit 40) is insufficient (S13: Yes), the control device 80 controls the operation of the nozzle transfer device 60 so as to transfer at least the insufficient quantity of the suction nozzles 90 from the nozzle station 11 to the maintenance pallet (washing pallet 32) (S14).

In the maintenance completed suction nozzle 90 stored in the nozzle management device (nozzle washing device 20), in a case where all of the suction nozzles 90 designated in the exchange operation cannot be supplied, it becomes necessary to supply the suction nozzle 90 by performing maintenance on the suction nozzle 90 held by the nozzle station 11. For example, the above-described maintenance includes washing and inspection of the suction nozzle 90, takes some time for processing, and affects the completion time of the exchange operation. In contrast, according to the above-described configuration, the maintenance operation can start to be preferentially performed (S14). Accordingly, the maintenance operation and the exchange operation can be concurrently performed. As a result, the exchange operation can be completed earlier.

Modification Example of Embodiment (Regarding Securing First Socket)

In the embodiment, the control device 80 secures the vacant retraction socket Sv in the storage pallet 51 (S21). In addition, the retraction socket Sv is secured by the control device 80 maintaining an empty state for any of the sockets K1 to K15 of the storage pallet 51 in the operation mode excluding the exchange operation.

Figure 7A:
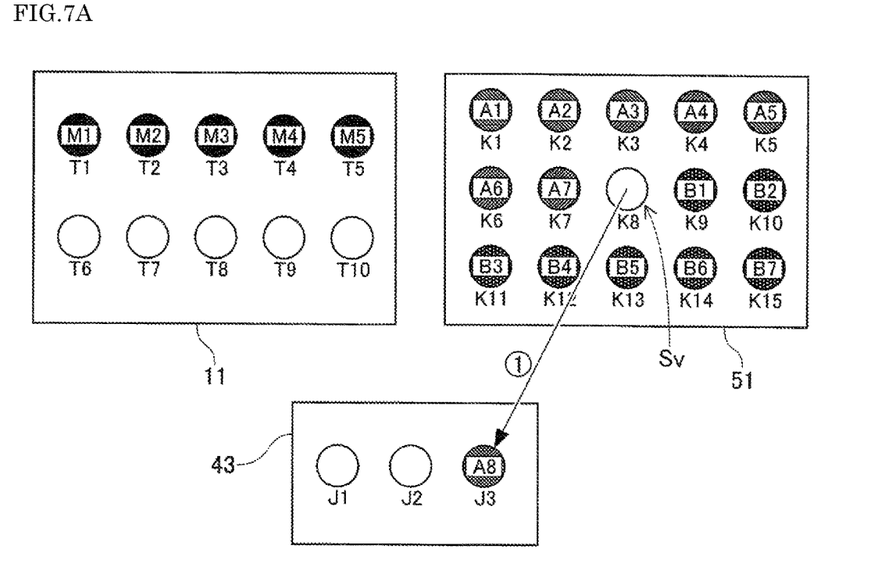
FIG. 7A is a view illustrating a securing operation of a vacant first socket according to a first modification example.

In contrast, the control device 80 may temporarily place the suction nozzle 90 outside the storage pallet 51 from the storage pallet 51 so as to secure the retraction socket Sv. Specifically, the control device 80 uses the jig placement table 43 as a temporary placement table. Here, each jig placement table 43 has the multiple sockets which can hold the suction nozzle 90 by adopting a predetermined posture in the movable range R of the nozzle transfer device 60. Here, in order to facilitate description, it is assumed that the jig placement table 43 has three sockets J1 to J3 as illustrated in FIG. 7A.

When the exchange operation is performed, for example, the control device 80 transfers the suction nozzle 90 which is not designated to be loaded to the nozzle station 11, from the storage pallet 51, or the surplus suction nozzle 90 (hereinafter, referred to as a "suction nozzle A8") to the socket J3 of the jig placement table 43. In this manner, the suction nozzle A8 serving as a temporarily placing target is held in the socket J3 of the jig placement table 43. In addition, in the storage pallet 51, the socket K8 holding the above-described suction nozzle A8 is emptied out, and the retraction step (S20) and the exchange step (S30) which are the same as those according to the embodiment can be performed.

Figure 7B:
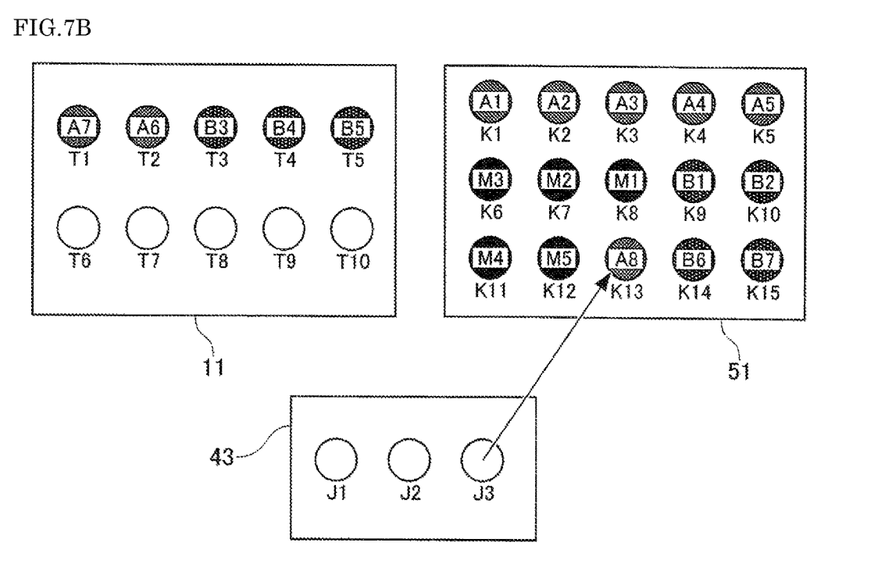
FIG. 7B is a view illustrating an operation for returning the retracted nozzle in post-processing according to the first modification example.

In addition, in a case where the control device 80 temporarily places the suction nozzle A8 outside the storage pallet 51 as described above, the control device 80 control the operation of the nozzle transfer device 60 so as to transfer the suction nozzle A8 temporarily placed in storage pallet 51 from the jig placement table 43 in the completion process (S40), for example. Specifically, as illustrated in FIG. 7B, the temporarily placed suction nozzle A8 is transferred from the socket J3 of the jig placement table 43 to the socket K13 of the storage pallet 51.

According to this configuration, the jig placement table 43 is used as a temporary placement table, thereby enabling the vacant retraction socket Sv to be secured in the storage pallet 51. Accordingly, the exchange operation can be performed corresponding to a case where the storage pallet 51 used for the exchange operation does not have the vacant socket.

Figure 8A:
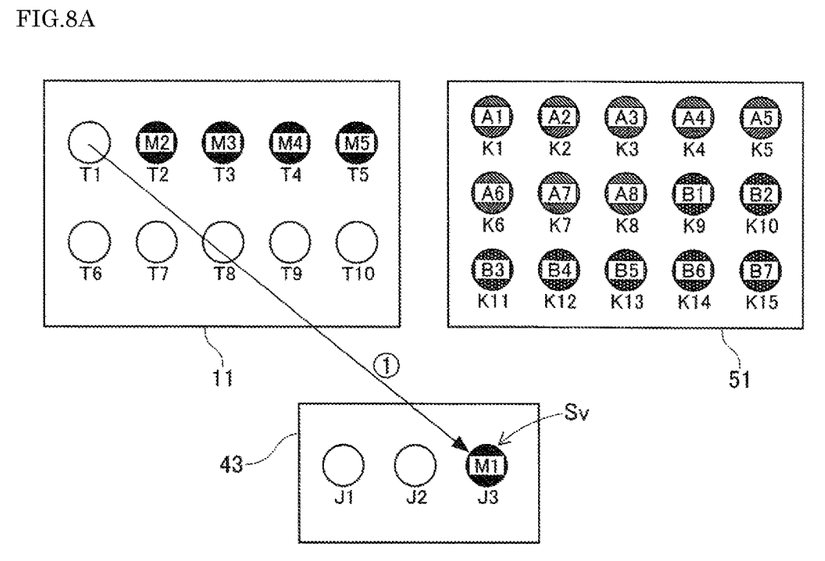
FIG. 8A is a view illustrating a retraction operation of causing a suction nozzle serving as a storage target to retract to a vacant first socket secured on a temporary placement table according to a second modification example.

Alternatively, a configuration may be adopted in which the vacant retraction socket Sv is secured in one of the sockets J1 to J3 of the jig placement table 43 serving as the temporary placement table. In the retraction step (S20), as illustrated in FIG. 8A, the control device 80 secures the socket J3 of the jig placement table 43 as the retraction socket Sv (S21), for example. Then, the control device 80 transfers the first suction nozzle M1 serving as the storage target to the socket J3 serving as the retraction socket Sv (S22).

In this manner, the first suction nozzle M1 serving as the storage target is held in the socket J3 of the jig placement table 43. In addition, the socket T1 holding the first suction nozzle M1 is emptied out in the nozzle station 11, and the exchange step (S30) the same as that according to the embodiment can be performed.

Figure 8B:
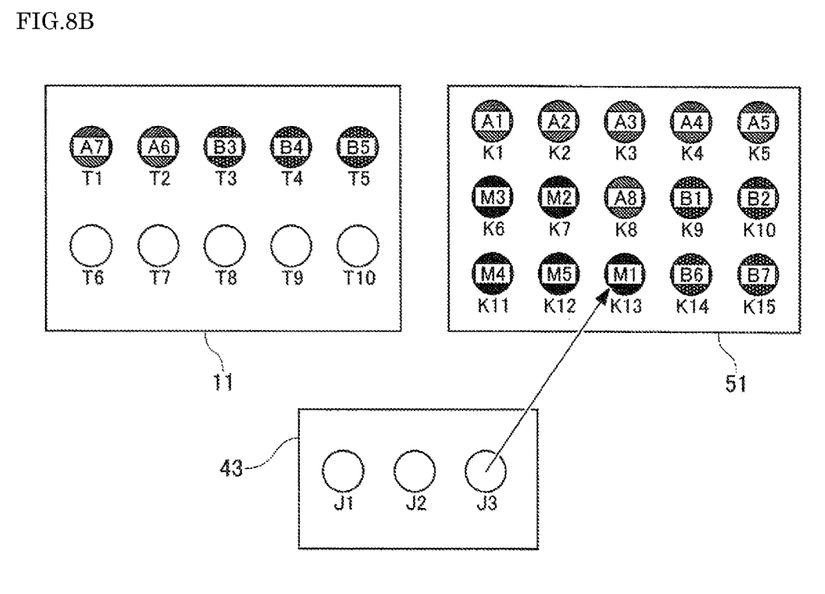
FIG. 8B is a view illustrating a returning operation of a retracted nozzle in post-processing according to the second modification example.

In addition, in a case where the control device 80 secures the retraction socket Sv outside the storage pallet 51 as described above, the control device 80 controls the operation of the nozzle transfer device 60 so as to transfer the first suction nozzle M1 from the jig placement table 43 to the storage pallet 51 in the completion process (S40), for example.

Specifically, as illustrated in FIG. 8B, the temporarily placed first suction nozzle M1 is transferred from the socket J3 of the jig placement table 43 to the socket K13 of the storage pallet 51.

According to this configuration, the jig placement table 43 is used as the temporary placement table, the exchange operation can be performed corresponding to a case where the storage pallet 51 used for the exchange operation does not have the vacant socket.

(Others)

In the embodiment, the target of the exchange operation is set to one nozzle station 11 installed in the nozzle station installation device 70. In contrast, in a case of targeting the multiple nozzle stations 11 installed in the nozzle station installation device 70, for example, the multiple nozzle stations 11 are regarded as one nozzle stations 11, the exchange operation can be performed similarly to the embodiment.

In addition, in the embodiment, the nozzle management device is the nozzle washing device that cleans the suction nozzle, and that is used in inspecting and storing the suction nozzle. In contrast, the nozzle management device may adopt an embodiment which does not have the washing unit 30 or the inspection unit 40, for example, and an embodiment in which the nozzle management device is an external device dedicated to storage, for example. According to this configuration, the same advantageous effect as that according to the embodiment can also be obtained.

REFERENCE SIGNS LIST

10: component mounting machine, 11: nozzle station, T1 to T10: socket, 20: nozzle washing device (nozzle management device), 30: washing unit (maintenance device), 31: washing chamber, 32: washing pallet (maintenance pallet), 33: blow device, 40: inspection unit (maintenance device), 41: load cell, 42: inspection camera, 43: jig placement table (temporary placement table), J1 to J5: socket, 50: nozzle stocker (stocker), 51: storage pallet (pallet), K1 to K15: socket, 52: accommodation device, 53: carrier, 53*a*: support arm, 60: nozzle transfer device, 61: transfer head, 62: holding chuck, 63: head camera, 70: nozzle station installation device, 71: reference base, 72: intermediate base, 80: control device, 85: discharge box, 90: suction nozzle, M1 to M5: suction nozzle serving as storage target, A1 to A8: (A-type maintenance completed) suction nozzle, B1 to B7: (B-type maintenance completed) suction nozzle, 91: trunk shaft, 92: flange, 93: nozzle shaft, 94: 2D code, R: movable range (of nozzle transfer device), Sv: retraction socket (first socket)

The invention claimed is:

1. A nozzle management device comprising:
   a pallet that stores suction nozzles used for a component mounting machine;
   a nozzle station installation device that targets a nozzle station which is detachably installed in the component mounting machine and which holds a plurality of the suction nozzles, and that installs the nozzle station detached from the component mounting machine;
   a nozzle transfer device that transfers the suction nozzles between the pallet and the nozzle station installed in the nozzle station installation device; and
   a control device that controls an operation of the nozzle transfer device in accordance with an operation mode,
   wherein the pallet and the nozzle station respectively have a plurality of sockets capable of holding the suction nozzles by adopting a predetermined posture,
   wherein the operation mode includes an exchange operation for transferring the plurality of the suction nozzles serving as storage targets from the nozzle station to the pallet, and for transferring the plurality of the suction nozzles which are respectively designated corresponding to the sockets of the nozzle station from the pallet,
   wherein in the exchange operation, the control device identifies a position of a vacant first socket, secures the first vacant socket, and transfers one of the plurality of the suction nozzles serving as one of the storage targets to the vacant first socket secured in a movable range of the nozzle transfer device,
   wherein thereafter, the control device controls the operation of the nozzle transfer device so as to alternately and repeatedly perform
      a loading operation for transferring the suction nozzle from the pallet to the socket of the nozzle station which is emptied out by the transferred suction nozzle, and
      an unloading operation for transferring one of the plurality of the suction nozzles serving as one of the storage targets from the nozzle station to the socket of the pallet which is emptied out by the loading operation, and
   wherein in the operation mode excluding the exchange operation, the control device maintains a vacant state for some of the plurality of sockets in the pallet, and secures the vacant first socket in the pallet in the movable range of the nozzle transfer device.

2. The nozzle management device according to claim 1, further comprising:
   a maintenance device that performs maintenance on the suction nozzles serving as management targets,
   wherein the maintenance device has a maintenance pallet which holds the suction nozzles in a movable range of the nozzle transfer device, and
   wherein in a case where compared to a quantity of the plurality of the suction nozzles designated in the exchange operation, a quantity of the suction nozzles stored in the nozzle management device after the maintenance is performed by the maintenance device is insufficient, the control device controls the operation of the nozzle transfer device so as to transfer at least the insufficient quantity of the suction nozzles from the nozzle station to the maintenance pallet.

3. The nozzle management device according to claim 1, further comprising:
   a temporary placement table capable of holding the suction nozzle,
   wherein when the exchange operation is performed, the control device transfers the suction nozzle from the pallet to the temporary placement table, and secures the vacant first socket in the pallet.

4. The nozzle management device according to claim 1, further comprising:
   a temporary placement table capable of holding the suction nozzle,
   wherein the vacant first socket is secured on the temporary placement table.

5. The nozzle management device according to claim 1, further comprising:
   a stocker that accommodates the plurality of pallets,
   wherein the stocker has a carrier which moves the pallets between a position where the plurality of pallets are accommodated and a position where the nozzle transfer device is capable of unloading the suction nozzle, and
   wherein in a case where the plurality of pallets accommodated in the stocker are required to transfer the plurality of the suction nozzles designated in the exchange operation to the nozzle station, the control device sets a combination of the plurality of pallets required for the exchange operation so as to minimize at least one of a movement number, a movement time, and a movement distance of the pallets, which are involved in a movement operation of the carrier.

6. A control method of a nozzle management device which includes
   a pallet that stores suction nozzles used for a component mounting machine,
   a nozzle station installation device that targets a nozzle station which is detachably installed in the component mounting machine and which holds a plurality of the suction nozzles, and that installs the nozzle station detached from the component mounting machine,
   a nozzle transfer device that transfers the suction nozzles between the pallet and the nozzle station installed in the nozzle station installation device, and
   a control device that controls an operation of the nozzle transfer device in accordance with an operation mode,
   wherein the pallet and the nozzle station respectively have a plurality of sockets capable of holding the suction nozzles by adopting a predetermined posture,
   wherein the operation mode includes an exchange operation for transferring the plurality of the suction nozzles serving as storage targets from the nozzle station to the pallet, and for transferring the plurality of the suction nozzles which are respectively designated corresponding to the sockets of the nozzle station from the pallet, the control method comprising:
   a retracting step including identifying a position of a vacant first socket, securing the vacant first socket, and transferring one of the plurality of the suction nozzles serving as one of the storage targets to the vacant first socket secured in a movable range of the nozzle transfer device, in the exchange operation; and an exchanging step of controlling the operation of the nozzle transfer device so as to alternately and repeatedly perform a loading operation for transferring the suction nozzle from the pallet to the socket of the nozzle station which is emptied out by the transferred suction nozzle, and an unloading operation for transferring one of the plurality of the suction nozzles serving as one of the storage targets from the nozzle station to the socket of the pallet which is emptied out by the loading operation, and wherein in the operation mode excluding the exchange operation, the control device maintains a vacant state for some of the plurality of sockets in the pallet, and secures the vacant first socket in the pallet in the movable range of the nozzle transfer device.

* * * * *